US011605756B2

(12) United States Patent
Kubis

(10) Patent No.: US 11,605,756 B2
(45) Date of Patent: Mar. 14, 2023

(54) LIGHT EMITTING DEVICE AND METHOD OF MAKING THE SAME

(71) Applicant: Purdue Research Foundation, West Lafayette, IN (US)

(72) Inventor: Tillmann Kubis, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 144 days.

(21) Appl. No.: 16/865,205

(22) Filed: May 1, 2020

(65) Prior Publication Data
US 2021/0057606 A1 Feb. 25, 2021

Related U.S. Application Data

(60) Provisional application No. 62/889,589, filed on Aug. 21, 2019.

(51) Int. Cl.
| | | |
|---|---|---|
| *H01L 33/06* | (2010.01) | |
| *H01L 33/38* | (2010.01) | |
| *H01L 33/44* | (2010.01) | |
| *H01L 27/15* | (2006.01) | |
| *H01L 33/00* | (2010.01) | |

(52) U.S. Cl.
CPC ............. *H01L 33/06* (2013.01); *H01L 27/15* (2013.01); *H01L 33/38* (2013.01); *H01L 33/44* (2013.01); *H01L 33/005* (2013.01); *H01L 2933/0016* (2013.01)

(58) Field of Classification Search
CPC ......... H01L 33/06; H01L 27/15; H01L 33/38; H01L 33/44; H01L 33/005; H01L 2933/0016; H01L 33/08
See application file for complete search history.

(56) References Cited

U.S. PATENT DOCUMENTS

| | | |
|---|---|---|
| 2003/0189215 A1 | 10/2003 | Lee et al. |
| 2004/0248377 A1 | 12/2004 | Yoo et al. |
| 2009/0086170 A1 | 4/2009 | El-Ghoroury et al. |
| 2013/0016752 A1* | 1/2013 | Lell ........................ H01S 5/4087 438/22 |
| 2013/0214247 A1* | 8/2013 | Hu .......................... H01L 33/04 438/47 |

(Continued)

OTHER PUBLICATIONS

International Search Report and Written Opinion issued by the ISA/US, Commissioner for Patents, dated Nov. 9, 2020, for International PCT Application No. PCT/US2020/047485; 9 pages.

*Primary Examiner* — Su C Kim
(74) *Attorney, Agent, or Firm* — Purdue Research Foundation

(57) ABSTRACT

A light emitting device includes a first light emitting diode (LED). The first LED includes a first metallic layer. The first LED additionally includes a p-doped semiconductor layer over the first metallic layer. Additionally, the first LED includes a multi quantum well (MQW) semiconductor layer over the p-doped semiconductor layer. Moreover, the first LED includes an n-doped semiconductor layer over the MQW semiconductor layer. Next, the first LED includes a second metallic layer over the n-doped semiconductor layer. The light emitting device also includes a second LED over the first LED. Further, the light emitting device includes a third LED over the second LED.

20 Claims, 3 Drawing Sheets

(56) References Cited

U.S. PATENT DOCUMENTS

| | | | |
|---|---|---|---|
| 2013/0270514 A1* | 10/2013 | Saxler | H01L 33/08 257/13 |
| 2016/0293083 A1* | 10/2016 | Yang | G09G 3/2003 |
| 2017/0005248 A1 | 1/2017 | Tomohiro | |
| 2019/0053347 A1* | 2/2019 | Lee | H01L 27/30 |
| 2019/0189596 A1* | 6/2019 | Chae | H01L 33/08 |
| 2019/0267436 A1* | 8/2019 | Zhang | H01L 27/3246 |

\* cited by examiner

LIGHT EMITTING DEVICE AND METHOD OF MAKING THE SAME

CROSS-REFERENCE TO RELATED APPLICATIONS

The present U.S. patent application is related to and claims the priority benefit of U.S. Provisional Patent Application Ser. No. 62/889,589, filed Aug. 21, 2019, the contents of which is hereby incorporated by reference in its entirety into this disclosure.

TECHNICAL FIELD

This disclosure relates to a light emitting device, and method of making the same.

BACKGROUND

This section introduces aspects that may help facilitate a better understanding of the disclosure. Accordingly, these statements are to be read in this light and are not to be understood as admissions about what is or is not prior art.

Switching the perceived color of large area lighting is hard to achieve: for large surface areas, LEDs or other light sources of various colors have to get combined with optics that spread the light into the area. Such optics are thick, rigid and expensive when they have to spread the light evenly over a large area. Thin and flexible light sources such as OLEDs have to put the light sources side-by-side like pixel in television or computer screens. In consequence, large areas need immense number of pixels with electronic control capable to handle orders of magnitude more pixel than state of art TV or computer screens. Covering large areas such as walls or floors can end up being prohibitively expensive.

SUMMARY 2D material-based LEDs are expected to cover large areas—building individual LEDs in the square-meter size with a homogeneous light emission over the total area without rigid optics. This technology combines several or many 2D material-based LEDs into a single light emitting device. The device allows to tune the output power of each of the LEDs so that the color perception of the light emitting device changes and the overall light output of the device can be dimmed.

The technology staggers the LEDs so that they cover the same area and require only minimal controlling electronics (controlling a single pixel). The LEDs can be staggered according to their emitted color and their transparency window: e.g. the emission frequency increases with the LED position in the staggered row (the reddest LED on the bottom, the bluest one on top). This prevents light emitted by deeper layer being absorbed by layers above (see FIG. 1).

One aspect of the present application relates to a light emitting device that includes a first light emitting diode (LED). The first LED includes a first metallic layer. The first LED additionally includes a p-doped semiconductor layer over the first metallic layer. Additionally, the first LED includes a multi quantum well (MQW) semiconductor layer over the p-doped semiconductor layer. Moreover, the first LED includes an n-doped semiconductor layer over the MQW semiconductor layer. Next, the first LED includes a second metallic layer over the n-doped semiconductor layer. The light emitting device also includes a second LED over the first LED. The second LED includes a third metallic layer. The second LED also includes a second p-doped semiconductor layer in physical contact the third metallic layer. Moreover, the second LED includes a second multi quantum well (MQW) semiconductor layer in physical contact the second p-doped semiconductor layer. Further, the second LED includes a second n-doped semiconductor layer in physical contact the second MQW semiconductor layer. Next, the second LED also includes a fourth metallic layer in physical contact with the second n-doped semiconductor layer. Further, the light emitting device includes a third LED over the second LED. The third LED includes a fifth metallic layer. Additionally, the third LED includes a third p-doped semiconductor layer over the fifth metallic layer. Further, the third LED includes a third multi quantum well (MQW) semiconductor layer over the third p-doped semiconductor layer. Moreover, the third LED includes a third n-doped semiconductor layer over the third MQW semiconductor layer. Next, the third LED includes a sixth metallic layer over the second n-doped semiconductor layer.

Another aspect of the present application relates to a light emitting device that includes a first light emitting diode (LED). The first LED includes a first metallic layer. The first LED additionally includes a p-doped semiconductor layer over the first metallic layer. Additionally, the first LED includes a multi quantum well (MQW) semiconductor layer over the p-doped semiconductor layer. Moreover, the first LED includes an n-doped semiconductor layer over the MQW semiconductor layer. Next, the first LED includes a second metallic layer over the n-doped semiconductor layer. The light emitting device also includes a second LED over the first LED. Further, the light emitting device includes a third LED over the second LED.

Still another aspect of the present application relates to a light emitting device that includes a first light emitting diode (LED). The first LED includes a first metallic layer. The first LED additionally includes a p-doped semiconductor layer over the first metallic layer. Additionally, the first LED includes a multi quantum well (MQW) semiconductor layer over the p-doped semiconductor layer. Moreover, the first LED includes an n-doped semiconductor layer over the MQW semiconductor layer. Next, the first LED includes a second metallic layer over the n-doped semiconductor layer. The light emitting device also includes a second LED over the first LED. The second LED includes a third metallic layer. The second LED also includes a second p-doped semiconductor layer in physical contact the third metallic layer. Moreover, the second LED includes a second multi quantum well (MQW) semiconductor layer in physical contact the second p-doped semiconductor layer. Further, the second LED includes a second n-doped semiconductor layer in physical contact the second MQW semiconductor layer. Next, the second LED also includes a fourth metallic layer in physical contact with the second n-doped semiconductor layer. Further, the light emitting device includes a third LED over the second LED.

BRIEF DESCRIPTION OF DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry, various features may not be drawn to scale and are used for illustration purposes only. In fact, the dimensions of the various features in the drawings may be arbitrarily increased or reduced for clarity of discussion.

DETAILED DESCRIPTION

Figure 1:
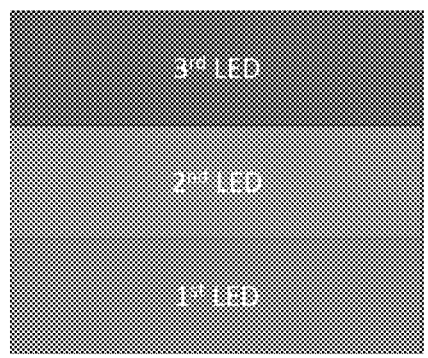
FIG. 1 illustrates a light emitting device with 3 LEDs staggered on top of each other.

For the purposes of promoting an understanding of the principles of the disclosure, reference will now be made to the embodiments illustrated in the drawings and specific language will be used to describe the same. It will nevertheless be understood that no limitation of the scope of the disclosure is thereby intended.

Figure 2:
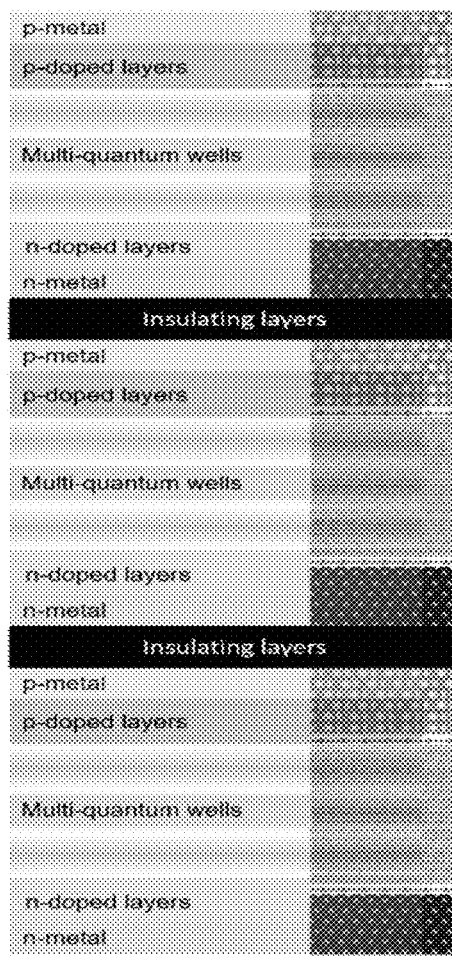
FIG. 2 illustrates a light emitting device with 3 2D material-based LEDs staggered on top of each other, with individual LEDs separated from each other by insulating layers.
Figure 3:
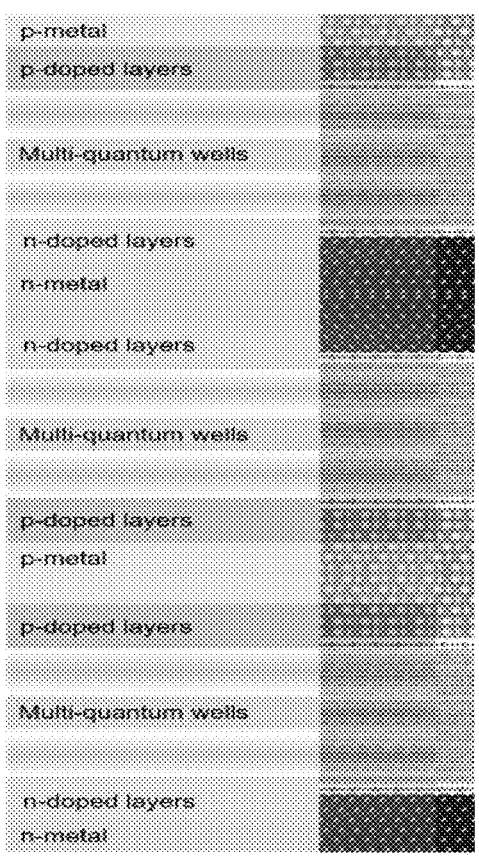
FIG. 3 illustrates a light emitting device with 3 2D material-based LEDs staggered on top of each other where the individual LEDs are not connected and the center LED's layer order is flipped compared to previous embodiments.

Various embodiments of the present application relate to 2D material-based LEDs containing p-type and n-type doped layers that are connected with metallic layers that cause low Schottky barriers to the respective doped layer. In between the doped areas are sequences of 2D layers that form multi-quantum well systems to confine electrons and holes in the same spatial region. The spatial overlap of electron and hole wave functions enables the emission of light of frequencies according to the chose 2D material layers and the sequence they are stacked in. One can separate the metallic leads of adjacent LEDs with insulating 2D material layers such as hexagonal boron nitride. This allows for individual and separate voltage and current settings of each individual LED. However, it also increases the complexity of the layered light emitting device (see FIG. 2). Alternatively, the orientation of adjacent LEDs, the order of their p-doped and n-doped layers can be alternated so that p-type and/or n-type metallic leads can provide charge to both adjacent LEDs. Controlling the relative output power of these LEDs will then require to change the voltages applied on the metallic layers relative to each LED, but the structural complexity, the number of layers in the light emitting device will be reduced (see FIG. 3)

Example 1

An embodiment of the present disclosure relates to a light emitting device that includes a first light emitting diode (LED). The first LED includes a first metallic layer. The first LED additionally includes a p-doped semiconductor layer over the first metallic layer. Additionally, the first LED includes a multi quantum well (MQW) semiconductor layer over the p-doped semiconductor layer. Moreover, the first LED includes an n-doped semiconductor layer over the MQW semiconductor layer. Next, the first LED includes a second metallic layer over the n-doped semiconductor layer. The light emitting device also includes a second LED over the first LED. The second LED includes a third metallic layer. The second LED also includes a second p-doped semiconductor layer in physical contact the third metallic layer. Moreover, the second LED includes a second multi quantum well (MQW) semiconductor layer in physical contact the second p-doped semiconductor layer. Further, the second LED includes a second n-doped semiconductor layer in physical contact the second MQW semiconductor layer. Next, the second LED also includes a fourth metallic layer in physical contact with the second n-doped semiconductor layer. Further, the light emitting device includes a third LED over the second LED. The third LED includes a fifth metallic layer. Additionally, the third LED includes a third p-doped semiconductor layer over the fifth metallic layer. Further, the third LED includes a third multi quantum well (MQW) semiconductor layer over the third p-doped semiconductor layer. Moreover, the third LED includes a third n-doped semiconductor layer over the third MQW semiconductor layer. Next, the third LED includes a sixth metallic layer over the second n-doped semiconductor layer.

In some embodiments, a first emitted light frequency of the first LED is smaller than a second emitted light frequency of the second LED, and wherein the second emitted light frequency of the second LED is smaller than a third emitted light frequency of the third LED.

In some embodiments, each of the first metallic layer, the p-doped semiconductor layer, the MQW semiconductor layer, the n-doped layer, and the second metallic layer is a material that includes two dimensional material layers.

In some embodiments, each of the third metallic layer, the second p-doped semiconductor layer, the second MQW semiconductor layer, the second n-doped layer, and the fourth metallic layer is a material that includes two dimensional material layers.

In some embodiments, each of the fifth metallic layer, the third p-doped semiconductor layer, the third MQW semiconductor layer, the third n-doped layer, and the sixth metallic layer is a material that includes two dimensional material layers.

In various embodiments, the light emitting device further includes a first pair of contacts. A first contact of the first pair of contacts is electrically coupled to the first metallic layer, and a second contact of the first pair of contacts is electrically coupled to the second metallic layer. The light emitting device additionally includes a second pair of contacts. A first contact of the second pair of contacts is electrically coupled to the third metallic layer, and a second contact of the second pair of contacts is electrically coupled to the fourth metallic layer. Additionally, the light emitting device includes a third pair of contacts. A first contact of the third pair of contacts is electrically coupled to the fifth metallic layer, and a second contact of the third pair of contacts is electrically coupled to the sixth metallic layer.

In one or more embodiments, the light emitting device further includes a voltage source electrically coupled to each of the first pair of contacts, the second pair of contacts, and the third pair of contacts.

According to one or more embodiments, the light emitting device further includes a first insulating layer between the first LED and the second LED; and a second insulating layer between the second LED and the third LED. In at least one embodiment, the second p-doped semiconductor layer is over the third metallic layer, the second multi quantum well (MQW) semiconductor layer over the second p-doped semiconductor layer, the second n-doped semiconductor layer over the second MQW semiconductor layer; and the fourth metallic layer over the second n-doped semiconductor layer.

In some embodiments, the second metallic layer is in physical contact with the fourth metallic layer.

In one or more embodiments, the light emitting device further includes a fourth LED over the third LED. The fourth LED includes a seventh metallic layer. Additionally, the fourth LED includes a fourth p-doped semiconductor layer in physical contact the seventh metallic layer. Moreover, the fourth LED includes a fourth multi quantum well (MQW)

semiconductor layer in physical contact the fourth p-doped semiconductor layer. Further, the fourth LED includes a fourth n-doped semiconductor layer in physical contact the fourth MQW semiconductor layer. Next, the fourth LED includes an eighth metallic layer in physical contact with the fourth n-doped semiconductor layer. In some embodiments, the light emitting device includes a third insulating layer between the third LED and the fourth LED. In some embodiments, the sixth metallic layer is in physical contact with the eighth metallic layer.

In at least one embodiment, the light emitting device includes the fourth p-doped semiconductor layer over the seventh metallic layer; the fourth multi quantum well (MQW) semiconductor layer over the fourth p-doped semiconductor layer; the fourth n-doped semiconductor layer over the fourth MQW semiconductor layer; and the eighth metallic layer over the fourth n-doped semiconductor layer A first emitted light frequency of the first LED is smaller than a second emitted light frequency of the second LED. The second emitted light frequency of the second LED is smaller than a third emitted light frequency of the third LED. The third emitted light frequency of the third LED is smaller than a fourth emitted light frequency of the fourth LED.

Example 2

An embodiment of the present disclosure relates to a method of making a light emitting device that includes a first light emitting diode (LED). A method of making the first LED includes forming a p-doped semiconductor layer over the first metallic layer. In at least one embodiment, the p-doped semiconductor layer is formed using a metalorganic chemical vapor deposition (MOCVD) process. In some embodiments, such layer is formed using molecular beam epitaxy (MBE), hydride vapor phase epitaxy (HVPE), mechanical or liquid-phase exfoliation, or other suitable formation method.

Additionally, the method of making the first LED includes forming a multi quantum well (MQW) semiconductor layer over the p-doped semiconductor layer. In at least one embodiment, the MQW semiconductor layer is formed using a metalorganic chemical vapor deposition (MOCVD) process. In some embodiments, such layer is formed using molecular beam epitaxy (MBE), hydride vapor phase epitaxy (HVPE), mechanical or liquid-phase exfoliation, or other suitable formation method.

Moreover, the method of making the first LED includes forming an n-doped semiconductor layer over the MQW semiconductor layer. In at least one embodiment, the n-doped semiconductor layer is formed using a metalorganic chemical vapor deposition (MOCVD) process. In some embodiments, such layer is formed using molecular beam epitaxy (MBE), hydride vapor phase epitaxy (HVPE), mechanical or liquid-phase exfoliation, or other suitable formation method.

Next, the method of making the first LED includes a second metallic layer over the n-doped semiconductor layer. In at least one embodiment, the second metallic layer is formed using a metalorganic chemical vapor deposition (MOCVD) process. In some embodiments, such layer is formed using molecular beam epitaxy (MBE), hydride vapor phase epitaxy (HVPE), mechanical or liquid-phase exfoliation, or other suitable formation method.

The light emitting device also includes a second LED over the first LED. A method of making the second LED includes forming a second p-doped semiconductor layer in physical contact the third metallic layer. In at least one embodiment, the second p-doped semiconductor layer is formed using a metalorganic chemical vapor deposition (MOCVD) process. In some embodiments, such layer is formed using molecular beam epitaxy (MBE), hydride vapor phase epitaxy (HVPE), mechanical or liquid-phase exfoliation, or other suitable formation method.

Moreover, the method of making the second LED includes forming a second multi quantum well (MQW) semiconductor layer in physical contact the second p-doped semiconductor layer. In at least one embodiment, the second multi quantum well semiconductor layer is formed using a metalorganic chemical vapor deposition (MOCVD) process. In some embodiments, such layer is formed using molecular beam epitaxy (MBE), hydride vapor phase epitaxy (HVPE), mechanical or liquid-phase exfoliation, or other suitable formation method.

Further, the method of making the second LED includes forming a second n-doped semiconductor layer in physical contact the second MQW semiconductor layer. In at least one embodiment, the second n-doped semiconductor layer is formed using a metalorganic chemical vapor deposition (MOCVD) process. In some embodiments, such layer is formed using molecular beam epitaxy (MBE), hydride vapor phase epitaxy (HVPE), mechanical or liquid-phase exfoliation, or other suitable formation method.

Next, the method of making the second LED also includes forming a fourth metallic layer in physical contact with the second n-doped semiconductor layer. In at least one embodiment, the fourth metallic layer is formed using a metalorganic chemical vapor deposition (MOCVD) process. In some embodiments, such layer is formed using molecular beam epitaxy (MBE), hydride vapor phase epitaxy (HVPE), mechanical or liquid-phase exfoliation, or other suitable formation method.

Further, the light emitting device includes a third LED over the second LED. Additionally, a method of making the third LED includes forming a third p-doped semiconductor layer over the fifth metallic layer. In at least one embodiment, the third p-doped semiconductor layer is formed using a metalorganic chemical vapor deposition (MOCVD) process. In some embodiments, such layer is formed using molecular beam epitaxy (MBE), hydride vapor phase epitaxy (HVPE), mechanical or liquid-phase exfoliation, or other suitable formation method.

Further, the method of making the third LED includes forming a third multi quantum well (MQW) semiconductor layer over the third p-doped semiconductor layer. In at least one embodiment, the third multi quantum well semiconductor layer is formed using a metalorganic chemical vapor deposition (MOCVD) process. In some embodiments, such layer is formed using molecular beam epitaxy (MBE), hydride vapor phase epitaxy (HVPE), mechanical or liquid-phase exfoliation, or other suitable formation method.

Moreover, the method of making the third LED includes forming a third n-doped semiconductor layer over the third MQW semiconductor layer. In at least one embodiment, the third n-doped semiconductor layer is formed using a metalorganic chemical vapor deposition (MOCVD) process. In some embodiments, such layer is formed using molecular beam epitaxy (MBE), hydride vapor phase epitaxy (HVPE), mechanical or liquid-phase exfoliation, or other suitable formation method.

Next, the method of making the third LED includes forming a sixth metallic layer over the second n-doped semiconductor layer. In at least one embodiment, the sixth metallic layer is formed using a metalorganic chemical vapor deposition (MOCVD) process. In some embodiments, such layer is formed using molecular beam epitaxy (MBE), hydride vapor phase epitaxy (HVPE), mechanical or liquid-phase exfoliation, or other suitable formation method.

In some embodiments, a first emitted light frequency of the first LED is smaller than a second emitted light frequency of the second LED, and wherein the second emitted light frequency of the second LED is smaller than a third emitted light frequency of the third LED.

In some embodiments, each of the first metallic layer, the p-doped semiconductor layer, the MQW semiconductor layer, the n-doped layer, and the second metallic layer is a material that includes two dimensional material layers.

In some embodiments, each of the third metallic layer, the second p-doped semiconductor layer, the second MQW semiconductor layer, the second n-doped layer, and the fourth metallic layer is a material that includes two dimensional material layers.

In some embodiments, each of the fifth metallic layer, the third p-doped semiconductor layer, the third MQW semiconductor layer, the third n-doped layer, and the sixth metallic layer is a material that includes two dimensional material layers.

In various embodiments, the method of making the light emitting device further includes forming a first pair of contacts. In at least one embodiment, the first pair of contacts are formed using a metalorganic chemical vapor deposition (MOCVD) process. In some embodiments, such contacts are formed using molecular beam epitaxy (MBE), hydride vapor phase epitaxy (HVPE), mechanical or liquid-phase exfoliation, or other suitable formation method. A first contact of the first pair of contacts is electrically coupled to the first metallic layer, and a second contact of the first pair of contacts is electrically coupled to the second metallic layer.

The method of making the light emitting device additionally includes forming a second pair of contacts. In at least one embodiment, the second pair of contacts are formed using a metalorganic chemical vapor deposition (MOCVD) process. In some embodiments, such contacts are formed using molecular beam epitaxy (MBE), hydride vapor phase epitaxy (HVPE), mechanical or liquid-phase exfoliation, or other suitable formation method. A first contact of the second pair of contacts is electrically coupled to the third metallic layer, and a second contact of the second pair of contacts is electrically coupled to the fourth metallic layer.

Additionally, the method of making the light emitting device includes forming a third pair of contacts. In at least one embodiment, the third pair of contacts is formed using a metalorganic chemical vapor deposition (MOCVD) process. In some embodiments, such contacts are formed using molecular beam epitaxy (MBE), hydride vapor phase epitaxy (HVPE), mechanical or liquid-phase exfoliation, or other suitable formation method. A first contact of the third pair of contacts is electrically coupled to the fifth metallic layer, and a second contact of the third pair of contacts is electrically coupled to the sixth metallic layer.

In one or more embodiments, the light emitting device further includes a voltage source electrically coupled to each of the first pair of contacts, the second pair of contacts, and the third pair of contacts.

According to one or more embodiments, the method of making the light emitting device further includes forming a first insulating layer between the first LED and the second LED. In at least one embodiment, the first insulating layer is formed using a metalorganic chemical vapor deposition (MOCVD) process. In some embodiments, such layer is formed using molecular beam epitaxy (MBE), hydride vapor phase epitaxy (HVPE), mechanical or liquid-phase exfoliation, or other suitable formation method.

The method of making the light emitting device further includes forming a second insulating layer between the second LED and the third LED. In at least one embodiment, the second insulating layer is formed using a metalorganic chemical vapor deposition (MOCVD) process. In some embodiments, such layer is formed using molecular beam epitaxy (MBE), hydride vapor phase epitaxy (HVPE), mechanical or liquid-phase exfoliation, or other suitable formation method.

In at least one embodiment, the second p-doped semiconductor layer is over the third metallic layer, the second multi quantum well (MQW) semiconductor layer over the second p-doped semiconductor layer, the second n-doped semiconductor layer over the second MQW semiconductor layer; and the fourth metallic layer over the second n-doped semiconductor layer.

In some embodiments, the second metallic layer is in physical contact with the fourth metallic layer.

In one or more embodiments, the method of making the light emitting device further includes forming a fourth LED over the third LED. The method of making the fourth LED includes a fourth p-doped semiconductor layer in physical contact the seventh metallic layer. In at least one embodiment, the fourth p-doped semiconductor layer is formed using a metalorganic chemical vapor deposition (MOCVD) process. In some embodiments, such layer is formed using molecular beam epitaxy (MBE), hydride vapor phase epitaxy (HVPE), mechanical or liquid-phase exfoliation, or other suitable formation method.

Moreover, the method of making the fourth LED includes forming a fourth multi quantum well (MQW) semiconductor layer in physical contact the fourth p-doped semiconductor layer. In at least one embodiment, the fourth multi quantum well semiconductor layer is formed using a metalorganic chemical vapor deposition (MOCVD) process. In some embodiments, such layer is formed using molecular beam epitaxy (MBE), hydride vapor phase epitaxy (HVPE), mechanical or liquid-phase exfoliation, or other suitable formation method.

Further, the method of forming the fourth LED includes forming a fourth n-doped semiconductor layer in physical contact the fourth MQW semiconductor layer. In at least one embodiment, the fourth n-doped semiconductor layer is formed using a metalorganic chemical vapor deposition (MOCVD) process. In some embodiments, such layer is formed using molecular beam epitaxy (MBE), hydride vapor phase epitaxy (HVPE), mechanical or liquid-phase exfoliation, or other suitable formation method.

Next, the method of making the fourth LED includes forming an eighth metallic layer in physical contact with the fourth n-doped semiconductor layer. In at least one embodiment, the eighth metallic layer is formed using a metalorganic chemical vapor deposition (MOCVD) process. In some embodiments, such layer is formed using molecular beam epitaxy (MBE), hydride vapor phase epitaxy (HVPE), mechanical or liquid-phase exfoliation, or other suitable formation method.

In some embodiments, the method of making the light emitting device includes forming a third insulating layer between the third LED and the fourth LED. In at least one embodiment, the third insulating layer is formed using a metalorganic chemical vapor deposition (MOCVD) process. In some embodiments, such layer is formed using molecular beam epitaxy (MBE), hydride vapor phase epitaxy (HVPE), mechanical or liquid-phase exfoliation, or other suitable formation method.

In some embodiments, the sixth metallic layer is in physical contact with the eighth metallic layer.

In at least one embodiment, the light emitting device includes the fourth p-doped semiconductor layer over the seventh metallic layer; the fourth multi quantum well (MQW) semiconductor layer over the fourth p-doped semiconductor layer; the fourth n-doped semiconductor layer over the fourth MQW semiconductor layer; and the eighth metallic layer over the fourth n-doped semiconductor layer A first emitted light frequency of the first LED is smaller than a second emitted light frequency of the second LED. The second emitted light frequency of the second LED is smaller than a third emitted light frequency of the third LED. The third emitted light frequency of the third LED is smaller than a fourth emitted light frequency of the fourth LED.

One of ordinary skill in the art would recognize that operations are added or removed from method, in one or more embodiments. One of ordinary skill in the art would also recognize that an order of operations in the above method is able to be changed, in some embodiments.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, design, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

The invention claimed is:

1. A light emitting device comprising:
   (a) a first light emitting diode (LED), wherein the first LED is formed by:
      (i) a first metallic layer;
      (ii) a p-doped semiconductor layer over the first metallic layer;
      (iii) a multi quantum well (MQW) semiconductor layer over the p-doped semiconductor layer;
      (iv) an n-doped semiconductor layer over the MQW semiconductor layer; and
      (v) a second metallic layer in physical contact with the n-doped semiconductor layer;
   (b) a first insulating layer over the second metallic layer;
   (c) a second LED over the first insulating layer, wherein the second LED is formed by:
      (i) a third metallic layer;
      (ii) a second p-doped semiconductor layer over the third metallic layer;
      (iii) a second MQW semiconductor layer over the second p-doped semiconductor layer;
      (iv) a second n-doped semiconductor layer over the second MQW semiconductor layer; and
      (v) a fourth metallic layer in physical contact with the second n-doped semiconductor layer;
   (d) a second insulating layer over the fourth metallic layer; and
   (e) a third LED over the second insulating layer, wherein the third LED is formed by:
      (i) a fifth metallic layer;
      (ii) a third p-doped semiconductor layer over the fifth metallic layer;
      (iii) a third MQW semiconductor layer over the third p-doped semiconductor layer;
      (iv) a third n-doped semiconductor layer over the third MQW semiconductor layer; and
      (v) a sixth metallic layer in physical contact with the third n-doped semiconductor layer.

2. The light emitting device of claim 1, further comprising:
   a first pair of contacts, wherein a first contact of the first pair of contacts is electrically coupled with the first metallic layer, and a second contact of the first pair of contacts is electrically coupled with the second metallic layer;
   a second pair of contacts, wherein a first contact of the second pair of contacts is electrically coupled with the third metallic layer, and a second contact of the second pair of contacts is electrically coupled with the fourth metallic layer; and
   a third pair of contacts, wherein a first contact of the third pair of contacts is electrically coupled with the fifth metallic layer, and a second contact of the third pair of contacts is electrically coupled with the sixth metallic layer.

3. The light emitting device of claim 2, further comprising:
   a voltage source electrically coupled to each of the first pair of contacts, the second pair of contacts, and the third pair of contacts.

4. The light emitting device of claim 1, further comprising:
   (a) a third insulating layer over the sixth metallic layer; and
   (b) a fourth LED over the third insulating layer, wherein the fourth LED includes:
      (i) a seventh metallic layer;
      (ii) a fourth p-doped semiconductor layer over the seventh metallic layer;
      (iii) a fourth MQW semiconductor layer over the fourth p-doped semiconductor layer;
      (iv) a fourth n-doped semiconductor layer over the fourth MQW semiconductor layer; and
      (v) an eighth metallic layer in physical contact with the fourth n-doped semiconductor layer.

5. The light emitting device of claim 1, wherein a first emitted light frequency of the first LED is smaller than a second emitted light frequency of the second LED, and wherein the second emitted light frequency of the second LED is smaller than a third emitted light frequency of the third LED.

6. The light emitting device of claim 4, wherein a first emitted light frequency of the first LED is smaller than a second emitted light frequency of the second LED, wherein the second emitted light frequency of the second LED is smaller than a third emitted light frequency of the third LED, and wherein the third emitted light frequency of the third LED is smaller than a fourth emitted light frequency of the fourth LED.

7. The light emitting device of claim 1, wherein each of the first metallic layer, the p-doped semiconductor layer, the MQW semiconductor layer, the n-doped semiconductor layer, and the second metallic layer is a material comprising two-dimensional material layers.

8. The light emitting device of claim 1, wherein each of the third metallic layer, the second p-doped semiconductor layer, the second MQW semiconductor layer, the second n-doped semiconductor layer, and the fourth metallic layer is a material comprising two-dimensional material layers.

9. The light emitting device of claim 1, wherein each of the fifth metallic layer, the third p-doped semiconductor layer, the third MQW semiconductor layer, the third n-doped semiconductor layer, and the sixth metallic layer is a material comprising two-dimensional material layers.

10. A light emitting device comprising:
   (a) a first light emitting diode (LED), wherein the first LED is formed by:
      (i) a first metallic layer;
      (ii) a p-doped semiconductor layer over the first metallic layer;
      (iii) a multi quantum well (MQW) semiconductor layer over the p-doped semiconductor layer;
      (iv) an n-doped semiconductor layer over the MQW semiconductor layer; and
      (v) a second metallic layer over the n-doped semiconductor layer;
   (b) a first insulating layer over the second metallic layer, wherein the first insulating later is formed using one of metalorganic chemical vapor deposition, molecular beam epitaxy, hydride vapor phase epitaxy, mechanical exfoliation, or liquid-phase exfoliation;
   (c) a second LED over the first insulating layer, wherein the second LED includes:
      (i) a third metallic layer;
      (ii) a second p-doped semiconductor layer over the third metallic layer;
      (iii) a second MQW semiconductor layer over the second p-doped semiconductor layer;
      (iv) a second n-doped semiconductor layer over the second MQW semiconductor layer; and
      (v) a fourth metallic layer over the second n-doped semiconductor layer;
   (d) a second insulating layer over the second metallic layer, wherein the second insulating later is formed using one of metalorganic chemical vapor deposition, molecular beam epitaxy, hydride vapor phase epitaxy, mechanical exfoliation, or liquid-phase exfoliation; and
   (e) a third LED over the second insulating layer.

11. The light emitting device of claim 10, further comprising:
   a first pair of contacts, wherein a first contact of the first pair of contacts is electrically coupled with the first metallic layer, and a second contact of the first pair of contacts is electrically coupled with the second metallic layer;
   a second pair of contacts, wherein a first contact of the second pair of contacts is electrically coupled with the third metallic layer, and a second contact of the second pair of contacts is electrically coupled with the fourth metallic layer.

12. The light emitting device of claim 11, further comprising:
   a voltage source electrically coupled to each of the first pair of contacts and the second pair of contacts.

13. The light emitting device of claim 10, wherein the third LED includes:
   (i) a fifth metallic layer;
   (ii) a third p-doped semiconductor layer over the fifth metallic layer;
   (iii) a third MQW semiconductor over the third p-doped semiconductor layer;
   (iv) a third n-doped semiconductor layer over the second MQW semiconductor layer; and
   (v) a sixth metallic layer over the third n-doped semiconductor layer.

14. The light emitting device of claim 13, further comprising a third pair of contacts, wherein a first contact of the third pair of contacts is electrically coupled with the fifth metallic layer, and a second contact of the third pair of contacts is electrically coupled with the sixth metallic layer.

15. The light emitting device of claim 10, wherein a first emitted light frequency of the first LED is smaller than a second emitted light frequency of the second LED, and wherein the second emitted light frequency of the second LED is smaller than a third emitted light frequency of the third LED.

16. The light emitting device of claim 10, wherein each of the first metallic layer, the p-doped semiconductor layer, the MQW semiconductor layer, the n-doped semiconductor layer, and the second metallic layer is a material comprising two-dimensional material layers.

17. A method of forming a light emitting device, wherein the light emitting devices includes a first light emitting diode (LED), a second LED, and a third LED, the method comprising:
   (a) forming the first LED, wherein forming the first LED includes:
      (i) depositing a first unitary metallic layer;
      (ii) layering a p-doped semiconductor layer over the first metallic layer;
      (iii) layering a multi quantum well (MQW) semiconductor layer over the p-doped semiconductor layer;
      (iv) layering an n-doped semiconductor layer over the MQW semiconductor layer; and
      (v) layering a second unitary metallic layer in physical contact with the n-doped semiconductor layer;
   (b) forming the second LED over the first LED, wherein forming the second LED includes:
      (i) layering a second n-doped semiconductor layer in physical contact with the second unitary metallic layer;
      (ii) layering a second MQW semiconductor layer over the second n-doped semiconductor layer;
      (iii) layering a second p-doped semiconductor layer over the second MQW semiconductor layer; and
      (iv) layering a third unitary metallic layer in physical contact with the second p-doped semiconductor layer; and
   (c) forming the third LED over the second LED, wherein forming the third LED includes:
      (i) layering a third p-doped semiconductor layer in physical contact with the third unitary metallic layer;
      (ii) layering a third MQW semiconductor layer over the third p-doped semiconductor layer;

(iii) layering a third n-doped semiconductor layer over the second MQW semiconductor layer; and
(iv) layering a fourth unitary metallic layer in physical contact with the third n-doped semiconductor layer.

18. The method of claim 17, further comprising:
(a) coupling a first pair of contacts with the first LED, wherein a first contact of the first pair of contacts is electrically coupled with the first unitary metallic layer and a second contact of the first pair of contacts is electrically coupled with the second unitary metallic layer;
(a) coupling a second pair of contacts with the second LED, wherein a first contact of the second pair of contacts is electrically coupled with the second unitary metallic layer and a second contact of the first pair of contacts is electrically coupled with the third unitary metallic layer; and
(a) coupling a third pair of contacts with the third LED, wherein a first contact of the third pair of contacts is electrically coupled with the third unitary metallic layer and a second contact of the third pair of contacts is electrically coupled with the fourth unitary metallic layer.

19. The method of claim 18, further comprising forming the first pair of contacts, the second pair of contacts, and the third pair of contacts, wherein forming each of the first pair of contacts, the second pair of contacts, and the third pair of contacts includes at least one of metalorganic chemical vapor deposition, molecular beam epitaxy, hydride vapor phase epitaxy, mechanical exfoliation, or liquid-phase exfoliation.

20. The method of claim 19, further comprising forming the first pair of contacts, the second pair of contacts, and the third pair of contacts, wherein forming each of the first pair of contacts, the second pair of contacts, and the third pair of contacts includes at least one of metalorganic chemical vapor deposition, molecular beam epitaxy, hydride vapor phase epitaxy, mechanical exfoliation, or liquid-phase exfoliation.

\* \* \* \* \*